United States Patent
Fukushima et al.

[11] Patent Number: 6,110,651
[45] Date of Patent: Aug. 29, 2000

[54] METHOD FOR PREPARING POLYSILANE PATTERN-BEARING SUBSTRATE

[75] Inventors: Motoo Fukushima; Shigeru Mori, both of Usui-gun, Japan

[73] Assignee: Shin-Etsu Chemical, Co., Ltd., Japan

[21] Appl. No.: 09/208,588

[22] Filed: Dec. 10, 1998

[30] Foreign Application Priority Data

Dec. 11, 1997 [JP] Japan .................................. 9-362183

[51] Int. Cl.$^7$ ...................................................... G03F 7/30
[52] U.S. Cl. ........................ 430/322; 430/297; 430/325
[58] Field of Search .................... 430/297, 322, 430/325

[56] References Cited

U.S. PATENT DOCUMENTS

| | | | |
|---|---|---|---|
| 4,587,205 | 5/1986 | Harrah | 430/326 |
| 5,082,872 | 1/1992 | Burns | 522/77 |
| 5,254,439 | 10/1993 | Tani | 430/326 |
| 6,015,596 | 1/2000 | Miwa | 427/489 |

FOREIGN PATENT DOCUMENTS

| | | |
|---|---|---|
| 60-119550 | 6/1985 | Japan . |
| 61-151536 | 7/1986 | Japan . |
| 4-31864 | 4/1992 | Japan . |
| 6-291273 | 10/1994 | Japan . |
| 7-114188 | 2/1995 | Japan . |

OTHER PUBLICATIONS

Abstract, JP-A 4–31864.
Patent Abstracts of Japan, 06291273 A.
Patent Abstracts of Japan, 07114188 A.

*Primary Examiner*—Sharon Gibson
*Assistant Examiner*—Nicole Barreca
*Attorney, Agent, or Firm*—Millen, White, Zelano & Branigan, P.C.

[57] ABSTRACT

A polysilane pattern-bearing substrate is prepared by the steps of (1) forming a polysilane film on a substrate, (2) subjecting the polysilane film to selective light exposure in the presence of a first solvent which does not dissolve polysilane, but dissolves siloxane, for converting the polysilane in selected areas to siloxane for thereby forming a pattern, (3) removing only the siloxane from the substrate of step (2) using a second solvent which does not dissolve polysilane, but dissolves siloxane, and (4) completely removing the second solvent. The polysilane pattern has a high degree of definition.

13 Claims, 1 Drawing Sheet

METHOD FOR PREPARING POLYSILANE PATTERN-BEARING SUBSTRATE

BACKGROUND OF THE INVENTION

1. Field of the Invention

This invention relates to a method for preparing a substrate having a finely defined polysilane pattern formed thereon.

2. Prior Art

Polysilane is very interesting in that it has the metallic and electron delocalization properties of silicon in contrast to carbon, and the desirable properties of high heat resistance, high flexibility and the ease of thin film formation. Polysilane is applicable to conductive and semiconductive materials. Additionally, since polysilane can be readily converted by photo-oxidation into siloxane having distinct properties, active research works have been made on polysilane for the purpose of developing photoresists for forming various patterns, as disclosed in JP-A 291273/1994. It is a common practice to subject a polysilane film on a substrate to light exposure for converting the polysilane in selected areas to siloxane and selectively leave only the polysilane areas on the substrate by utilizing the difference in solvent solubility between polysilane and siloxane.

However, the polysilane has a poor sensitivity as resist and requires a long term of light exposure even when high intensity UV (Ultraviolet light) is used. Since long term exposure can cause concomitant formation of solvent-insoluble components when polysilane is converted into polysiloxane, scum is left behind to reduce the accuracy of a ultrafine pattern.

In this connection, JP-A 119550/1985 discloses exposure to soft x-rays of 5.4 Å in air and subsequent development with methyl alcohol for 30 seconds. JP-A 151536/1986 discloses exposure to a 500-W xenon-mercury lamp (254 nm), dipping in ethyl cellosolve for 1 minute for development, and rinsing with isopropyl alcohol. JP-A 31864/1992 discloses exposure to a 500-W xenon-mercury lamp (254 nm) and development in a hexamethyldisiloxane/octamethylcyclotetrasiloxane (⅞ by volume) developer for 30 seconds. These prior art methods are to effect light exposure to form dark patterns, followed by dipping in a developer solution. By making a proper choice among various developers, the resulting pattern can be improved in precision, but the frequent formation of scum is a problem.

To overcome this and other drawbacks, JP-A 114188/1995 discloses an attempt to increase the rate of photolysis using a radical photo-generator such as a trihalo-substituted triazine and an oxidizing agent such as t-butyl peroxide. However, since these additives prevent UV radiation from reaching the bulk of the polymer and some areas other than the selected pattern to be exposed can be exposed to irregularly reflected light, it is impossible that only the polysilane areas assigned to light exposure be completely converted into polysiloxane areas. This is not necessarily a method for forming a finely defined pattern.

SUMMARY OF THE INVENTION

An object of the invention is to provide a method for forming a finely defined polysilane pattern on a substrate through inexpensive, simple, and quick steps.

We found that prior art polysilane patterns lack fine definition because polysilane is converted into lower molecular weight ones as a result of photo-cleavage of Si—Si bonds, and some side chain groups in the resulting polysiloxane are decomposed by light exposure whereby the siloxane is further crosslinked to become insoluble in the developer solution. Continuing further investigations, we have found that when selective light exposure is made in the presence of a solvent that does not dissolve polysilane, but dissolves siloxane, the siloxane converted from polysilane in exposed areas can be removed to define a pattern before some side chain groups in the siloxane are decomposed whereby the siloxane is further crosslinked to become insoluble in the developer solution. As a result, a substrate bearing a finely defined pattern is obtained.

Therefore, the present invention provides a method for preparing a polysilane pattern-bearing substrate, comprising the steps of:

(1) forming a polysilane film on a substrate, (2) subjecting the polysilane film to selective light exposure in the presence of a first solvent which does not dissolve polysilane, but dissolves siloxane, for converting the polysilane in selected areas to siloxane for thereby forming a pattern, (3) removing only the siloxane from the substrate of step (2) using a second solvent which does not dissolve polysilane, but dissolves siloxane, and (4) completely removing the second solvent from the substrate of step (3).

According to the invention, a substrate bearing a finely defined polysilane pattern is obtained through inexpensive, simple, and quick steps. When a silver salt is then applied to the pattern, for example, there is obtained a substrate on which a highly conductive pattern is formed to a high degree of definition, that is, a high definition, high conductivity, ultrafine pattern-bearing substrate, which will find use as electronic materials. Therefore, the inventive method can be widely used in electric, electronic and communication fields as a method for forming useful materials which will find use as various printed circuit boards, flexible switches, battery electrodes, solar batteries, sensors, antistatic protective films, and electromagnetic shield housings.

DESCRIPTION OF THE PREFERRED EMBODIMENTS

Figure 1A:
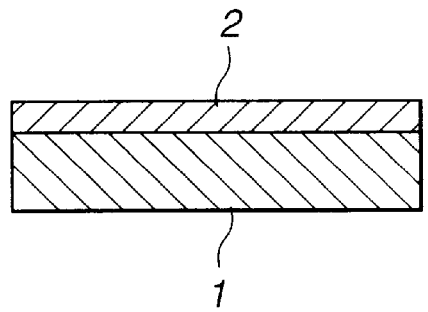
FIGS. 1A to 1D illustrate successive steps of a method for preparing a polysilane pattern-bearing substrate according to the invention, FIGS. 1A, 1B, 1C and 1D corresponding to steps (1), (2), (3) and (4), respectively.

Referring to FIGS. 1A to 1D, the method for preparing a polysilane pattern-bearing substrate according to the invention is described. Step (1) of the method is to form a polysilane film 2 on a substrate 1 as shown in FIG. 1A.

More particularly, a thin film composed mainly of polysilane is formed on a suitable substrate. The substrate used may be selected from insulators such as glass, ceramics and plastics, semiconductors such as silicon, and conductors such as aluminum and copper.

Any of polysilanes having Si—Si bonds in their backbone and soluble in organic solvents may be used herein. Preferred is a polysilane of the following formula (I):

(I)

wherein $R^1$ and $R^2$, which may be the same or different, are substituted or unsubstituted monovalent hydrocarbon groups, X is a substituted or unsubstituted monovalent hydrocarbon group, alkoxy group or halogen atom, letters m, n and p are numbers satisfying $1 \leq m+n+p \leq 2.2$ and q is an integer of from 10 to 100,000.

In formula (I), when $R^1$ and $R^2$ are aliphatic or alicyclic hydrocarbon groups, the number of carbon atoms is preferably 1 to 12, more preferably 1 to 8. When $R^1$ and $R^2$ are aromatic hydrocarbon groups, the number of carbon atoms is preferably 6 to 14, more preferably 6 to 10. Examples of $R^1$ and $R^2$ include alkyl groups such as methyl, ethyl, propyl, butyl, hexyl, cyclohexyl, octyl and decyl, cycloalkyl groups such as cyclopentyl and cyclohexyl, aryl groups such as phenyl, tolyl, naphthyl and biphenyl, aralkyl groups such as benzyl and phenylethyl, and substituted hydrocarbon groups in which some or all of the hydrogen atoms are replaced by halogen atoms (e.g., fluorine and chlorine), amino groups.

X is a group as defined for $R^1$, or an alkoxy group of 1 to 8 carbon atoms or a halogen atom such as chlorine. Most often, X is a chlorine atom or an alkoxy group such as methoxy and ethoxy because the group X is to prevent separation of the polysilane film from the substrate or to improve the adhesion of the polysilane film to the substrate.

Individual values of m, n, p and q are not so important insofar as the polysilane is soluble in organic solvents and can be coated on a substrate to a uniform thickness of 0.1 to 1,000 μm. Letters m, n and p are numbers satisfying $1 \leq m+n+p \leq 2.2$ and q is an integer of from 10 to 100,000. Preferably m is a number from 0.1 to 1, especially from 0.5 to 1, n is a number from 0.1 to 2, especially from 0.5 to 1.5, and p is a number from 0 to 0.5, especially from 0 to 0.2.

Any desired method may be used for forming the polysilane film. Conventional thin film forming methods are useful, for example, spin coating, dipping, casting, vacuum evaporation, and Langmuir-Blodgett (LB) methods. Especially preferred is a spin coating method of applying a polysilane solution to a substrate rotating at a high speed. Examples of the solvent in which the polysilane is dissolved include aromatic hydrocarbons such as benzene, toluene and xylene and ether solvents such as tetrahydrofuran (THF) and dibutyl ether. After application, the coating may be dried by keeping it in a dry atmosphere for a while or by allowing it to stand in vacuum at a temperature of about 40 to 60° C. The polysilane solution preferably has a concentration of 1 to 20% by weight whereby a polysilane thin film having a thickness of 0.1 to 1,000 μm can be formed.

Figure 1B:
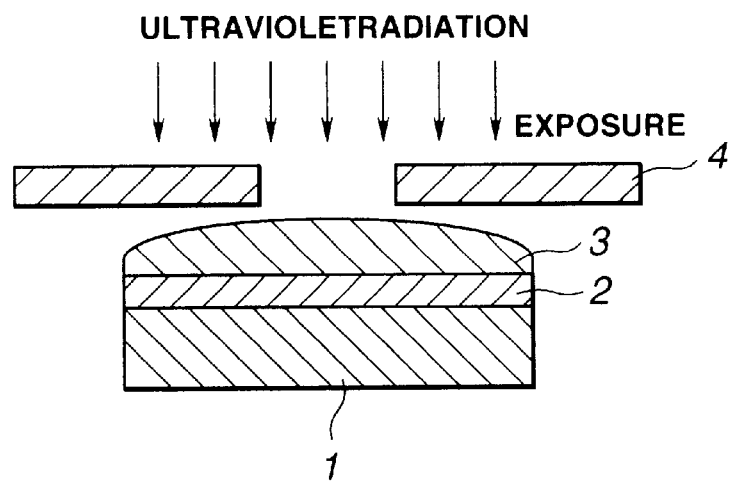

Step (2) is, as shown in FIG. 1B, to subject the polysilane film 2 on the substrate 1 to selective light exposure in the presence of a first solvent 3 which does not dissolve polysilane, but dissolves siloxane, thereby forming a pattern. More particularly, a first solvent 3 is applied to the polysilane film 2 on the substrate, a patterned mask 4 is placed over the polysilane film 2, and ultraviolet radiation from a suitable source is irradiated to the polysilane film 2 through the mask 4. That is, a selected area of the polysilane film 2 on the substrate 1 is exposed to light in the presence of the solvent 3 capable of dissolving siloxane. As polysiloxane is formed in the selected area of the polysilane film, the polysiloxane is continuously dissolved away without crosslinking by further oxidative decomposition. The area of the polysilane film being exposed to light is continuously converted into polysiloxane without becoming insoluble in the solvent.

Step (2) may use the same irradiation apparatus as used in the prior art polysilane photo-oxidation patterning step. Light exposure is usually made in a dose of 0.001 to 100 J/cm². Especially for a polysilane film thickness of 0.1 to 1 μm, a dose of 0.01 to 10 J/cm² is given.

The light source used herein may be selected from continuous spectrum light sources such as hydrogen discharge lamps, rare gas discharge lamps, tungsten lamps, and halogen lamps and discontinuous spectrum light sources such as lasers and mercury lamps. Mercury lamps are preferred because they are inexpensive and easy to handle.

The first solvent capable of dissolving siloxane, but not polysilane is typically a liquid monohydric alcohol. The monohydric alcohol is generally represented by R-OH wherein R is a monovalent hydrocarbon group. Exemplary monohydric alcohols are aliphatic alcohols such as methanol, ethanol, n-propanol, isopropanol, n-butanol, isobutanol, t-butanol, pentanol, hexanol, heptanol, and octanol, and phenols such as phenol and cresol.

Figure 1C:
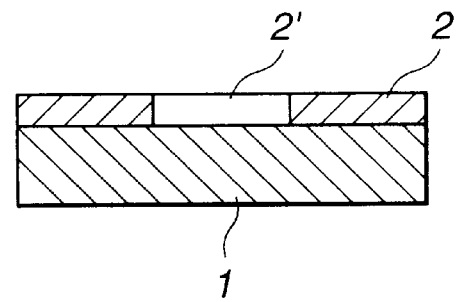

Step (3) is, as shown in FIG. 1C, to remove only siloxane 2' from the polysilane film 2 on the substrate resulting from step (2) using a second solvent which does not dissolve the polysilane film 2, but dissolves siloxane 2'. The second solvents used herein include the first solvents used in step (2), aliphatic hydrocarbons such as hexane, heptane, and octane, ketones such as acetone and methyl ethyl ketone, polyhydric alcohols such as ethylene glycol and propylene glycol, and aqueous solutions thereof. Where the siloxane formed by light exposure has been fully dissolved away in step (2), step (2) also serves as step (3), that is, steps (2) and (3) are simultaneously effected (in this case, the second solvent is equal to the first solvent). Typically, the film 2 is immersed in the second solvent for 0 to 1,000 seconds.

Figure 1D:
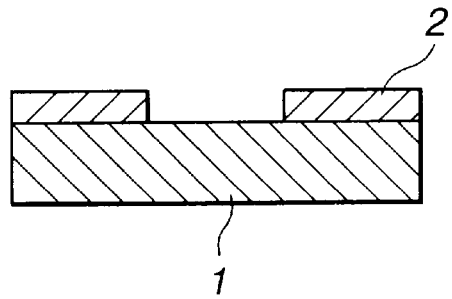

Finally, step (4) is to completely remove the second solvent from the substrate of step (3) as shown in FIG. 1D. By maintaining the substrate in a hot or vacuum environment, the solvent can be fully removed. More effective removal of the solvent may be effected by rotating the substrate at a high speed. Heating is preferably carried out to room temperature to about 150° C. for about 1 minute to about 10 hours under atmospheric pressure or vacuum. Heating temperatures above 150° C. are undesirable because polysilane can be oxidized too. Most often, solvent removal is fully achieved by heating at a temperature of 30 to 100° C. for about 1 minute to about 1 hours. Under these conditions, the polysilane in unexposed areas remains substantially unchanged while polysilane in exposed areas is fully converted to polysiloxane and dissolved away in the solvent. There is left a fine polysilane pattern.

According to the invention, a substrate bearing a polysilane pattern having a high degree of definition is obtained through inexpensive, simple, and quick steps. Therefore, the inventive method can be widely used as a method for forming useful polysilane patterns which will find use in various printed circuit boards, flexible switches, battery electrodes, solar batteries, sensors, integrated patterns, and motor housings.

EXAMPLE

Examples of the invention are given below by way of illustration and not by way of limitation.

Synthesis Example

Preparation of Polysilane

In a nitrogen stream, metallic sodium was added to toluene, which was agitated at a high speed for dispersion while heating at 100 to 120° C. With stirring, a dichlorodiorganosilane was slowly added dropwise to the dispersion. There were used 2 to 3 mol of metallic sodium and 1 mol of the silicon compound. Agitation was continued for 4 hours until the reactants disappeared, for driving the reaction to completion. The reaction solution was allowed to cool. After the salt was filtered off, the filtrate was concentrated, obtaining a polysilane.

More specifically, phenylmethylpolysilane was synthesized as follows.

In a nitrogen stream, 5.06 g (220 mmol) of metallic sodium was added to 60 ml of toluene, which was agitated at a high speed for dispersion while heating at 110° C. With stirring, 19.1 g (100 mmol) of phenylmethyldichlorosilane was slowly added dropwise to the dispersion. Agitation was continued for 4 hours until the reactants disappeared, for driving the reaction to completion. The reaction solution was allowed to cool. After the salt was filtered off, the filtrate was concentrated, obtaining 10.0 g (crude yield 83%) of a polysilane crude product. The polymer was dissolved again in 30 ml of toluene, to which 120 ml of hexane was added. The resulting precipitate was separated, obtaining 6.6 g (yield 55%) of phenylmethylpolysilane having a weight average molecular weight of 45,000.

Polymer films having the desired thickness could be obtained by dissolving the thus synthesized polymers in toluene to form a 10% toluene solution, and spin coating the solution.

Examples 1–2 and Comparative Examples 1–3

A polysilane (i.e., phenylmethylpolysilane prepared in Synthesis Example) was dissolved in toluene to form a 10% solution. The polysilane solution was spin coated on a glass plate at 3,000 rpm for 10 seconds and dried for one hour at 50° C. and 5 Torr to form a thin film of 1.0 μm thick. There was obtained a coated substrate (that is, substrate 1 having a polysilane film 2 formed thereon as shown in FIG. 1A), which was subject to a patterning step.

On a quartz substrate, lines of 2 to 4 μm wide were formed from metallic chromium at a spacing of 10 μm. This was used as a photomask.

Ethanol, 1 ml, was spread on the coated substrate, and the photomask was placed thereover. In a dry box, a 20-W low pressure mercury lamp was burned to illuminate ultraviolet radiation of 254 nm to selected areas of the polysilane film in a dose of 4.0 J/cm². After exposure, the substrate was dipped in methanol for 2 seconds and then rotated at a high speed of 3,000 rpm for 10 seconds, thereby spinning off the methanol and removing the polysiloxane areas therewith. The substrate was vacuum dried at 50° C. and 5 Torr for one hour to completely remove the solvent.

In this way, there was obtained the glass substrate on which a polysilane pattern was formed (Example 1). The pattern was examined for a degree of resolvable definition.

A polysilane pattern-bearing substrate was similarly prepared using isopropanol instead of ethanol (Example 2).

For comparison purposes, polysilane pattern-bearing substrates were similarly prepared without using ethanol (Comparative Example 1), or by using water instead of ethanol (Comparative Example 2), or by using a dihydric alcohol, ethylene glycol instead of ethanol (Comparative Example 3).

The data about the patterns on these substrates are shown in Table 1.

TABLE 1

|  | Solvent applied between substrate and photomask | Degree of resolvable definition |
| --- | --- | --- |
| E1 | ethanol | definite 2-μm lines |
| E2 | isopropanol | definite 2-μm lines |
| CE1 | none | indefinite 4-μm lines |
| CE2 | water | indefinite 4-μm lines |
| CE3 | ethylene glycol | indefinite 4-μm lines |

Japanese Patent Application No. 362183/1997 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A method for preparing a polysilane pattern-bearing substrate, comprising the steps of:
   (1) forming a polysilane film on a substrate,
   (2) subjecting the polysilane film to selective light exposure in the presence of a first solvent which does not dissolve polysilane, but dissolves siloxane, the light exposure converting the polysilane in selected areas to siloxane for forming a pattern,
   (3) removing only the siloxane from the substrate of step (2) using a second solvent which does not dissolve polysilane, but dissolves siloxane, and
   (4) completely removing the second solvent from the substrate of step (3).

2. The method of claim 1 wherein said first solvent which does not dissolve polysilane, but dissolves siloxane is a monohydric alcohol.

3. The method of claim 1 wherein said polysilane is of the following formula (I):

$(R^1{}_m R^2{}_n X_p Si)_q$        (I)

wherein $R^1$ and $R^2$ are independently substituted or unsubstituted monovalent hydrocarbon groups, X is a substituted or unsubstituted monovalent hydrocarbon group, alkoxy group or halogen atom, letters m, n and p are numbers satisfying $1 \leq m+n+p \leq 2.2$ and q is an integer of from 10 to 100,000.

4. The method of claim 3, wherein in formula (I) $R^1$ and $R^2$ are selected from alkyl cycloalkyl, phenyl, tolyl, naphthyl, biphenyl, benzyl or phenethyl groups of 1–12 carbon atoms or 6–14 carbon atoms where they contain aromatic groups, each of which are optionally substituted by halogen atoms or amino groups.

5. The method of claim 3, wherein in formula (I) m is a number from 0.1 to 1, n is a number from 0.1 to 2 and p is a number from 0 to 0.5.

6. The method of claim 1, wherein the first solvent and the second solvent are the same solvent and steps (2) and (3) are simultaneously effected.

7. The method of claim 1, wherein the polysilane is formed on the substrate to a uniform thickness of 0.1 to 1000 μm.

8. The method of claim 1, wherein the light exposure in step (2) is at a dose of 0.01 to 10 J/cm².

9. The method of claim 1, wherein the light exposure in step (2) is by hydrogen discharge lamp, rare gas discharge lamp, tungsten lamp, halogen lamp, laser or mercury lamp.

10. The method of claim 1, wherein the first solvent is methanol, ethanol, n-propanol, isopropanol, n-butanol, isobutanol, pentanol, hexanol, heptanol, octanol, phenol or cresol.

11. The method of claim 1, wherein the second solvent is a monohydric alcohol, an aliphatic hydrocarbon, a ketone, a polyhydric alcohol or an aqueous solution of one of the above.

12. The method of claim 1, wherein the first solvent and second solvent are different and steps (2) and (3) are conducted separately.

13. The method of claim 1, wherein the second solvent is removed from the substrate by heating and/or applying a vacuum.

\* \* \* \* \*